United States Patent [19]
Wu

[11] Patent Number: 6,096,642
[45] Date of Patent: Aug. 1, 2000

[54] METHOD OF FORMING SELF-ALIGNED SILICIDE IN INTEGRATED CIRCUIT WITHOUT CAUSING BRIDGING EFFECTS

[75] Inventor: Der-Yuan Wu, Hsinchu, Taiwan

[73] Assignee: United Microelectronics Corp., Hsinchu, Taiwan

[21] Appl. No.: 09/135,496

[22] Filed: Aug. 17, 1998

[30] Foreign Application Priority Data

Jun. 8, 1998 [TW] Taiwan ................................. 87109053

[51] Int. Cl.⁷ ................................................. H01L 21/336
[52] U.S. Cl. .................... 438/655; 438/299; 438/301; 438/303; 438/305; 438/307
[58] Field of Search .................... 438/655, 299–307, 438/592, 595–596, 656–657, 663–664, 682–683

[56] References Cited

U.S. PATENT DOCUMENTS

| | | | |
|---|---|---|---|
| 5,496,750 | 3/1996 | Moslehi | 438/297 |
| 5,656,519 | 8/1997 | Mogami | 438/303 |
| 5,686,331 | 11/1997 | Song | 438/303 |
| 5,872,039 | 2/1999 | Imai | 438/291 |
| 5,879,997 | 3/1999 | Lee et al. | 438/300 |
| 5,891,784 | 4/1999 | Cheung et al. | 438/303 |
| 5,902,125 | 5/1999 | Wu | 438/300 |

*Primary Examiner*—Charles Bowers
*Assistant Examiner*—Thanh Nguyen
*Attorney, Agent, or Firm*—Thomas, Kayden, Horstemeyer & Risley

[57] ABSTRACT

A method is provided for forming self-aligned silicide in integrated circuit, which can help prevent the occurrence of a bridging effect in the integrated circuit. This method is characterized in the provision of an elevated spacer structure that can act like a barrier to prevent the occurrence of a bridging effect between the polysilicon gate and the source/drain regions caused by the forming of undesired silicide over the spacer structure due to lateral diffusion of the silicide from the polysilicon gate. Moreover, this method is characterized in the use of two different materials to respectively form the sacrificial layer and the field oxide layers, thus allowing the field oxide layers to remain substantially intact during the removal of the sacrificial layer through etching. This feature can help prevent the occurrence of leakage current from the metal plug to the substrate.

20 Claims, 4 Drawing Sheets

METHOD OF FORMING SELF-ALIGNED SILICIDE IN INTEGRATED CIRCUIT WITHOUT CAUSING BRIDGING EFFECTS

CROSS-REFERENCE TO RELATED APPLICATION

This application claims the priority benefit of Taiwan application Ser. No. 87109053, filed Jun. 8, 1998, the full disclosure of which is incorporated herein by reference.

BACKGROUND OF THE INVENTION

1. Field of the Invention

This invention relates to semiconductor fabrication technologies, and more particularly, to a method of forming self-aligned silicide, also called salicide, in an integrated circuit (IC) without causing a bridging effect.

2. Description of Related Art

As semiconductor fabrication technologies advance to the submicron level of integration, the transistor elements in the integrated circuits, such as MOS (metal-oxide semiconductor) transistors, are formed with even smaller line widths. The downsizing of the polysilicon gates and wiring lines in MOS devices will then cause an increase in the resistance thereof. One solution to this problem is to form one or more metallization layers over the polysilicon gates and wiring lines and then convert these metallization layers into silicide through annealing. Since silicide has very good conductivity, it can help increase the conductivity of the polysilicon gates and wiring lines.

FIG. 1 is a schematic sectional diagram used to depict a conventional method for forming self-aligned silicide in a MOS IC device. As shown, the MOS IC device is constructed on a semiconductor substrate 100, such as a P-type substrate. A plurality of field oxide layers 102 are then formed in the substrate 100 to define the active regions (only one is shown in FIG. 1) where MOS transistors are to be formed. These field oxide layers 102 can be formed, for example, through a LOCOS (Local Oxidation of Silicon) process or an STI (Shallow Trench Isolation) process. The STI process is preferable since it allows the field oxide layers 102 to be sized more easily in fabrication and is more suitable for use in the fabrication of high-density IC devices with a submicron level of integration below 0.25 μm (micrometer). Subsequently, conventional processes are performed to form a gate oxide layer 104 over the substrate 100 and then a polysilicon gate 106 over the gate oxide layer 104.

In the subsequent step, a pair of source/drain regions 118 are formed in the substrate 100 to define the channel region of the MOS transistor. Each of the source/drain regions 118 is composed of a lightly doped area 112 and a heavily doped area 117. The LDD (lightly doped drain) structure for the source/drain regions 118 can prevent a hot carrier effect due to a short channel. Moreover, a spacer structure 114 is formed from silicon oxide on the sidewall of the polysilicon gate 106.

In the subsequent step, a self-aligned silicide process is performed to form silicide layers 120, 122, respectively, over the polysilicon gate 106 and the source/drain regions 118 for the purpose of increasing the conductivity thereof. The self-aligned silicide process includes a first step of forming a metallization layer from a refractory metal over the substrate 100; a second step of performing a thermal annealing process on the wafer so as to allow the refractory metal to react with the silicon atoms in the polysilicon gate 106 and the source/drain regions 118 to thereby form silicide; and a third step of performing a wet etching process to remove selected portions of the silicide layer, with the remaining portions serving as the above-mentioned silicide layers 120, 122. After this, a dielectric layer 126 is formed over the entire top surface of the wafer; and then a contact window 128 is formed in the dielectric layer 126 to expose one of the silicide layers 122 formed over the source/drain regions 118. Next, a metal plug 130 is formed in the contact window 128.

One drawback to the foregoing self-aligned silicide process, however, is that the thermal annealing process can also cause the silicon atoms in the polysilicon gate 106 and the source/drain regions 118 to diffuse laterally, which can then cause formation of titanium siuicide layers 124a, 124b over the silicon oxide formed spacer structure 114. When a large amount of titanium silicide layer (for example the titanium silicide layer 124a on the left side of the polysilicon gate 106) forms, it can cause a bridging effect over the spacer structure 114, thus electrically interconnecting the polysilicon gate 106 and the source/drain regions 118. In other words, a short-circuit will occur between the polysilicon gate 106 and the source/drain regions 118, causing the resultant MOS transistor to be inoperable. Even though the titanium silicide layer (for example the titanium silicide layer 124b on the right side of the polysilicon gate 106) is not large enough to cause a bridging effect, it can nonetheless cause a short-circuit between the polysilicon gate 106 and the metal plug 130 formed in dielectric layer 126.

One conventional solution to the foregoing problem is depicted in the following with reference to FIGS. 2A–2B which are schematic sectional diagrams used to depict another conventional method for forming self-aligned silicide in a MOS IC device.

Referring first to FIG. 2A, the MOS IC device is constructed on a semiconductor substrate 200. A plurality of field oxide layers 202 are then formed at predefined locations over the substrate 200 to define the active regions (only one is shown) where MOS transistors are to be formed. Alter this, a gate oxide layer 204, a polysilicon gate 206, and a topping layer 210 are successively formed over the substrate 200 through conventional processes. Next. with the topping layer 210 serving as mask, a first ion-implantation process is performed on the wafer so as to dope an impurity element 216 of a low concentration into the unmasked portions of the wafer, thereby forming lightly doped areas 212 in the substrate 200. Further, a spacer structure 214 is formed on the sidewall of the stacked structure of the gate oxide layer 204, the polysilicon gate 206, and the topping layer 210. After this, with the spacer structure 214 serving as a mask, a second ion-implantation process is performed on the wafer so as to dope an impurity element into the polysilicon gate 206 to increase the conductivity thereof and also into the unmasked portions of the lightly doped areas 212 to form heavily doped areas 217. The heavily doped area 217 and the lightly doped area 212 in combination constitute a pair of source/drain regions 218 for the MOS transistor.

Referring next to FIG. 2B, in the subsequent step, the topping layer 210 is removed. Then, a self-aligned silicide process is performed to form silicide layers 220, 222, respectively, over the polysilicon gate 206 and the source/drain regions 218 for the purpose of increasing the conductivity thereof. This self-aligned silicide process includes a first step of forming a metallization layer from a refractory metal over the substrate 200; a second step of performing a thermal annealing process on the wafer so as to allow the refractory metal to react with the silicon atoms in the polysilicon gate 206 and the source/drain regions 218 to thereby form silicide; and a third step of performing a wet etching process to remove selected portions of the silicide layer, with the remaining portions serving as the abovementioned silicide layers 220, 222. After this, a dielectric layer 226 is formed over the entire top surface of the wafer and then a contact window 228 is formed in the dielectric layer 226 to expose one of the silicide layers 222 formed over the source/drain regions 218. Next, a metal plug 230 is formed in the contact window 228.

The foregoing self-aligned silicide process differs from that utilized in the method of FIG. 1 particularly in that the etching process is controlled in such a manner that allows the topmost surface of the polysilicon gate 206 to be lower than the topmost point of the spacer structure 214. This can prevent the occurrence of a bridging effect over the spacer structure 214 that would electrically connect the polysilicon gate 106 to the source/drain region 218 due to lateral diffusion of silicon atoms from the polysilicon gate 206.

One drawback to the foregoing method, however, is that the same ion implantation process is used for the forming of the doped polysilicon gate 206 and the heavily doped areas 217 of the source/drain regions 218, thus requiring the impurity ions to be high enough in energy so as to be able to penetrate through the topping layer 210 into the polysilicon gate 206. However, higher energy ions would then cause the shallow junction 240 of the source/drain region 218 to be further increased in depth, easily causing a punch-through effect.

It seems that the foregoing problem can be solved simply by removing the topping layer 210 prior to the performing of the ion-implantation process. However, this is be unfeasible due to the fact that the topping layer 210 and the field oxide layers 202 are both formed from oxide so that the removal of the topping layer 210 through etching could also etch away a top part of the field oxide layers 202. This would cause the topmost side of the field oxide layers (as indicated by the reference numeral 202a in FIG. 2B) to be lower than the bottommost side of the source/drain regions 218. In the case that the contact window 228 is formed through a borderless contact method, as the case shown in FIG. 2B, the metal plug 230 easily comes through the void portion above the field oxide layer 202a and makes contact with substrate 200 at the part indicated by the reference numeral 250 in FIG. 2B, thereby resulting in a leakage current at the contact 250. Therefore, in order to prevent the occurrence of this leakage current, the contact window 228 should be formed precisely at the predefined location. However, this may not be easy to achieve.

SUMMARY OF THE INVENTION

It is therefore an objective of the present invention to provide a method of forming self-aligned silicide in an integrated circuit, which can help prevent the occurrence of a bridging effect in the integrated circuit.

It is another objective of the present invention to provide a method of forming self-aligned silicide in an integrated circuit, which allows the ion-implantation process for forming the heavily doped areas of the source/drain regions to be performed with a lower energy when compared to the prior art and also allows the field oxide layers not to be overly etched.

In accordance with the foregoing and other objectives of the present invention, a new method of forming self-aligned silicide in an integrated circuit is provided.

The method of the invention includes the following steps: preparing a semiconductor substrate; forming a gate oxide layer at a selected location over the substrate; forming a polysilicon gate over the gate oxide layer; forming an etch-end layer over the polysilicon gate; forming a sacrificial layer over the etch-end layer; forming a spacer structure on the sidewall of the stacked structure of the gate oxide layer, the polysilicon gate, the etch-end layer, and the sacrificial layer; forming source/drain regions in the substrate; performing an etching process to remove the sacrificial layer until the etch-end layer is exposed; removing the etch-end layer; forming a metallization layer over the entire wafer; performing a thermal annealing process to allow those portions of the metallization layer that are laid directly over the polysilicon gate and the source/drain regions to be converted into silicide; and removing all the unreacted part of the metallization layer.

In the foregoing process, the step of forming the source/drain regions comprises the substeps of: performing a first ion-implantation process prior to the step of forming the spacer structure, so as to form lightly-doped areas in the substrate on both sides of the stacked structure of the gate oxide layer, the polysilicon gate, the etch-end layer, and the sacrificial layer; and performing a second ion-implantation process after the etch-end layer is removed and prior to the forming of the metallization layer, so as to form heavily-doped areas in the substrate and meanwhile allow the polysilicon gate to be doped to increase the conductivity thereof, the lightly-doped areas and the heavily-doped areas in combination constituting the source/drain regions.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

FIGS. 3A–3D are schematic sectional diagrams used to depict the steps involved in the method of the invention for forming self-aligned silicide in an MOS IC device.

Figure 3A:
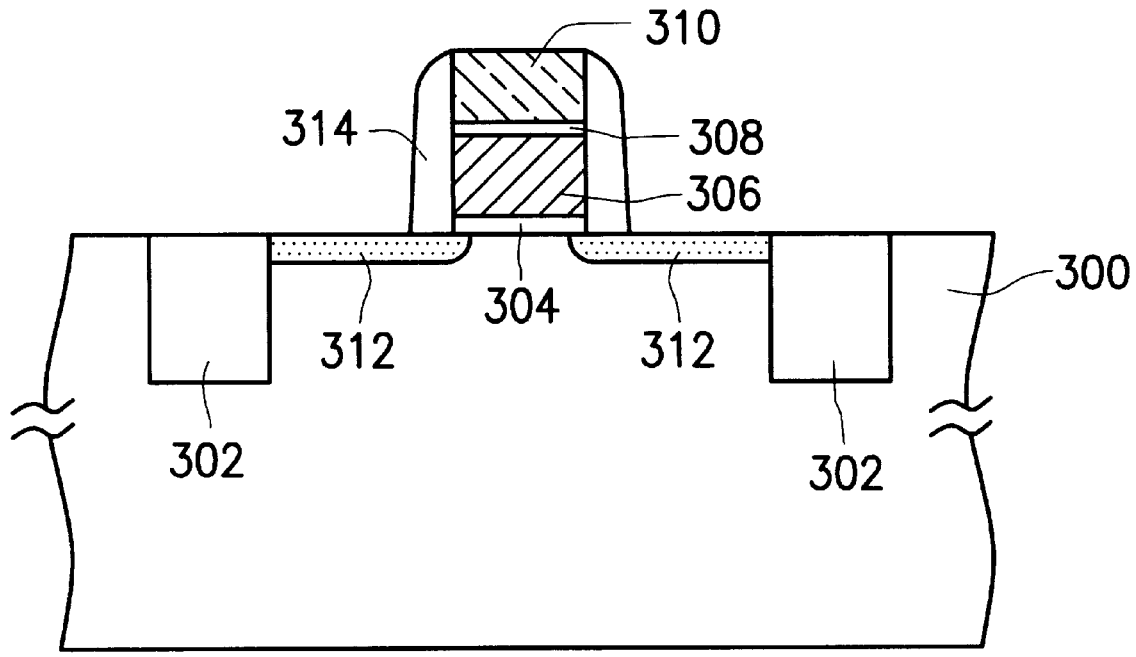
FIGS. 3A–3D are schematic sectional diagrams used to depict the steps involved in the method of the invention for forming self-aligned silicide in a MOS IC device.

Referring first to FIG. 3A, the MOS IC device is constructed on a semiconductor substrate 300, such as a P-type silicon substrate. A plurality of field oxide layers 302 are then formed at predefined locations in the substrate 300 to define the active regions (only one is shown in the drawings) where MOS transistors are to be formed. Next, a gate oxide layer 304 is formed at a selected location within the active region over the substrate 300. Then, successively a polysilicon gate 306 is formed over the gate oxide layer 304; an etch-end layer 308 is formed over the polysilicon gate 306; and a sacrificial layer 3 10 is formed over the etch-end layer 308. After this, lightly doped areas 312 are formed at selected locations in the substrate 300 where a pair of source/drain regions are to be formed. Next, a spacer structure 314 is formed on the sidewalls of the stacked structure of the gate oxide layer 304, the polysilicon gate 306, the etch-end layer 308, and the sacrificial layer 310.

The field oxide layers 302 can be formed, for example, through LOCOS (Local Oxidation of Silicon) process or STI (Shallow Trench Isolation) process, and more preferably from STI process. The STI process includes a first step of forming a plurality of trenches in the substrate 300 where the field oxide layers 302 are to be formed, and a second step of performing a CVD (chemical-vapor deposition) process to deposit oxide into the trenches. The oxide in the trenches then serves as the above-mentioned field oxide layers 302. The gate oxide layer 304 can be formed for example, through a thermal oxidation process or a CVD process to a thickness of from 30 Å to 300 Å (angstrom). The polysilicon gate 306 can be formed, for example, through an LPCVD (low-pressure chemical-vapor deposition) process to a thickness of 1,000–4,000 Å.

The etch-end layer 308 should be formed from a material that is significantly larger in etching ratio than the sacrificial layer 3 10. The sacrificial layer 310 can be formed, for example from polysilicon through a CVD process. In the case of using polysilicon to form the sacrificial layer 310, the etch-end layer 308 is preferably formed from silicon oxide through a CVD process to a thickness of from 20–80 Å.

In the MOS transistor structure, the LDD (lightly-doped drain) structure will be used to form the source/drain regions, which can help reduce the hot carrier effect due to a channel shorter than 2 μm. In the forming of the lightly-doped areas 312, the sacrificial layer 310 is used as mask during the ion-implantation process to dope a low concentration of impurity ions, such as phosphorus ions, into the substrate 300. The spacer structure 314 is preferably formed by, for example, first forming a layer of a dielectric material, such as silicon nitride or silicon oxide, over the entire top surface of the wafer; and then performing an anisotropic etching process on the dielectric layer to thereby form the spacer structure 314.

Figure 3B:
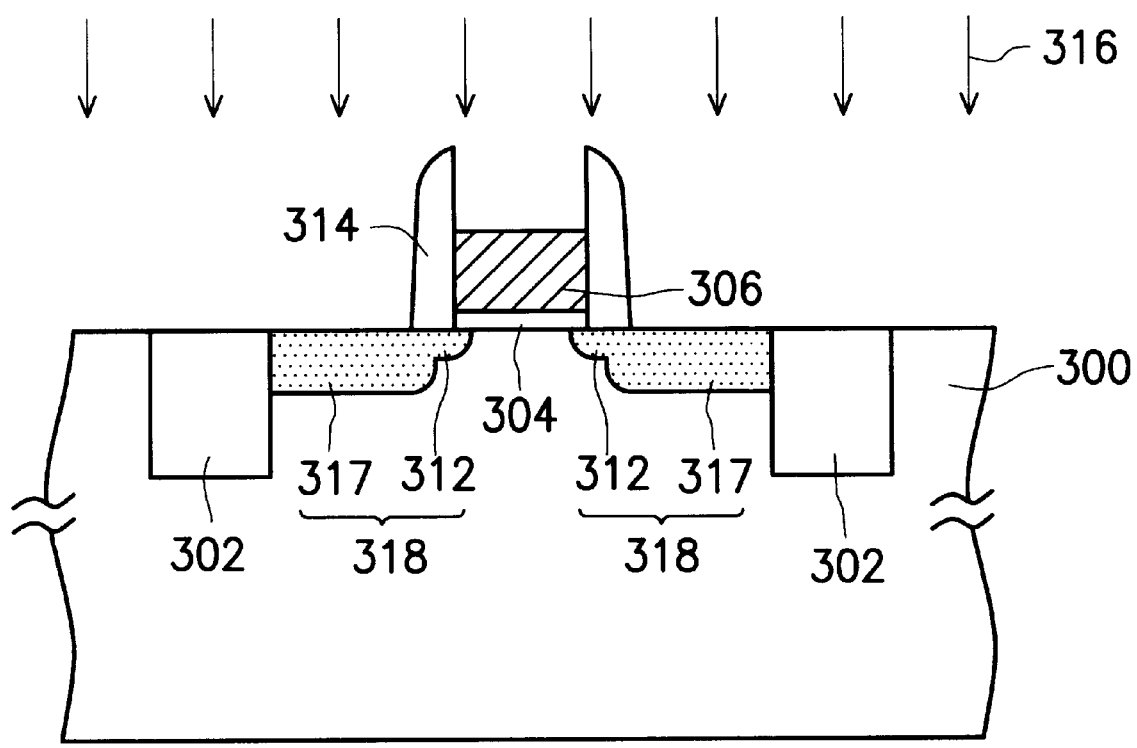

Referring next to FIG. 3B, in the subsequent step, an etching process is performed on the wafer, with the etch-end layer 308 serving as an etch-end point, to thereby etch away the entire sacrificial layer 310. After this, the entire etch-end layer 308 is removed to expose the underlying polysilicon gate 306. As shown, this makes the topmost point of the spacer structure 314 higher than the topmost side of the polysilicon gate 306. Subsequently, with the spacer structure 314 serving as mask, an ion-implantation process is performed on the wafer so as to dope an impurity element 316 in ion form into the polysilicon gate 306 so as to increase the conductivity thereof and also into the exposed portions of the lightly-doped areas 312 to thereby turn them into heavily-doped areas 317. The lightly doped areas 312 and the heavily doped areas 317 in combination constitute a pair of source/drain regions 318 for the MOS transistor.

Figure 2A:
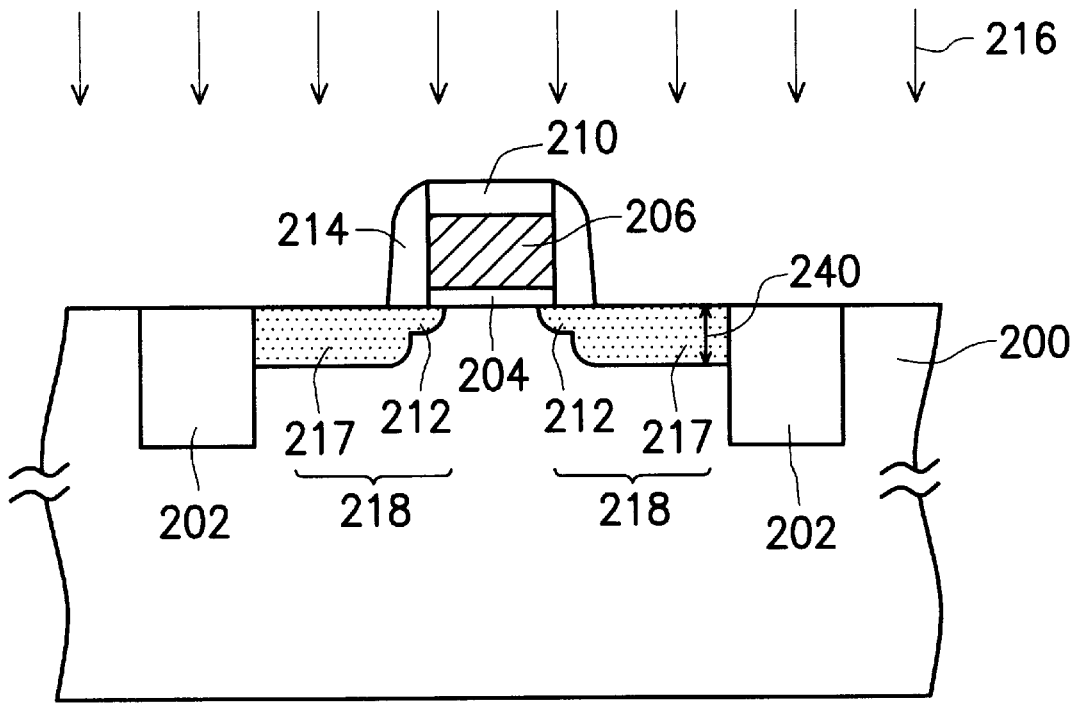
FIGS. 2A–2B are schematic sectional diagrams used to depict another conventional method for forming self-aligned silicide in a MOS IC device.
Figure 2B:
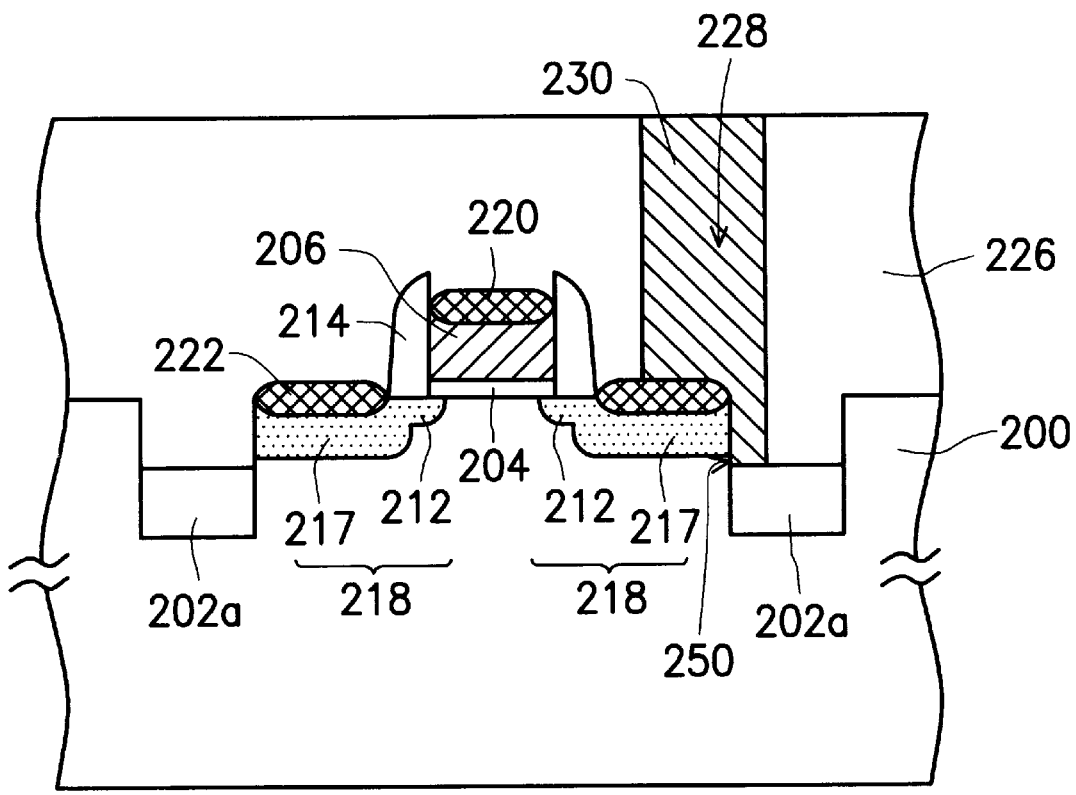

It is a characteristic part of the invention that the impurity ions 316 are doped directly into the polysilicon gate 306 without having to first penetrate through a topping layer (such as the topping layer 210 shown in the prior art of FIG. 2A). This allows the impurity ions 316 to be implanted with a low energy and also allows the source/drain regions 318 to be formed with a shallow junction. Moreover, the method of invention allows the topmost point of the spacer structure 314 to be higher than the topmost side of the polysilicon gate 306 after the sacrificial layer 310 and the etch-end layer 308 are entirely removed. This allows the spacer structure 314 to act like an elevated barrier to the polysilicon gate 306, which barrier can help prevent the occurrence of a bridging effect between the polysilicon gate 306 and the source/drain regions 318 as in the prior art. Furthermore, since the sacrificial layer 310 and the field oxide layers 302 are formed from two different materials, the etching process used to remove the sacrificial layer 310 substantially allows the field oxide layers 302 to be intact. Since the etch-end layer 308 is very thin, 20–80 Å in this embodiment, the etching process used to remove the etch-end layer 308 only removes a negligibly small part of the field oxide layers 302.

Figure 3C:
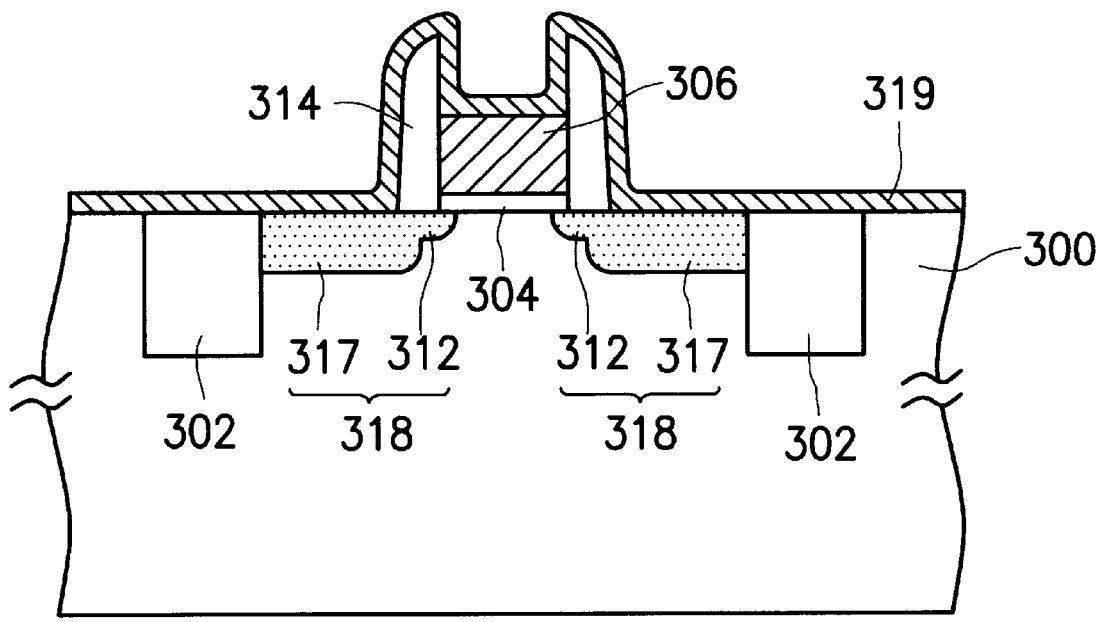

Referring further to FIG. 3C, in the subsequent step, a metallization layer 319 is deposited to a substantially uniform thickness over the entire top surface of the wafer, preferably from a refractory metal, such as titanium, tungsten, cobalt, nickel, platinum, or palladium, and most preferably from titanium. In this embodiment, the metallization layer 319 is formed from titanium through a magnetically controlled DC sputtering process to a thickness of 200–1,000 Å.

Figure 3D:
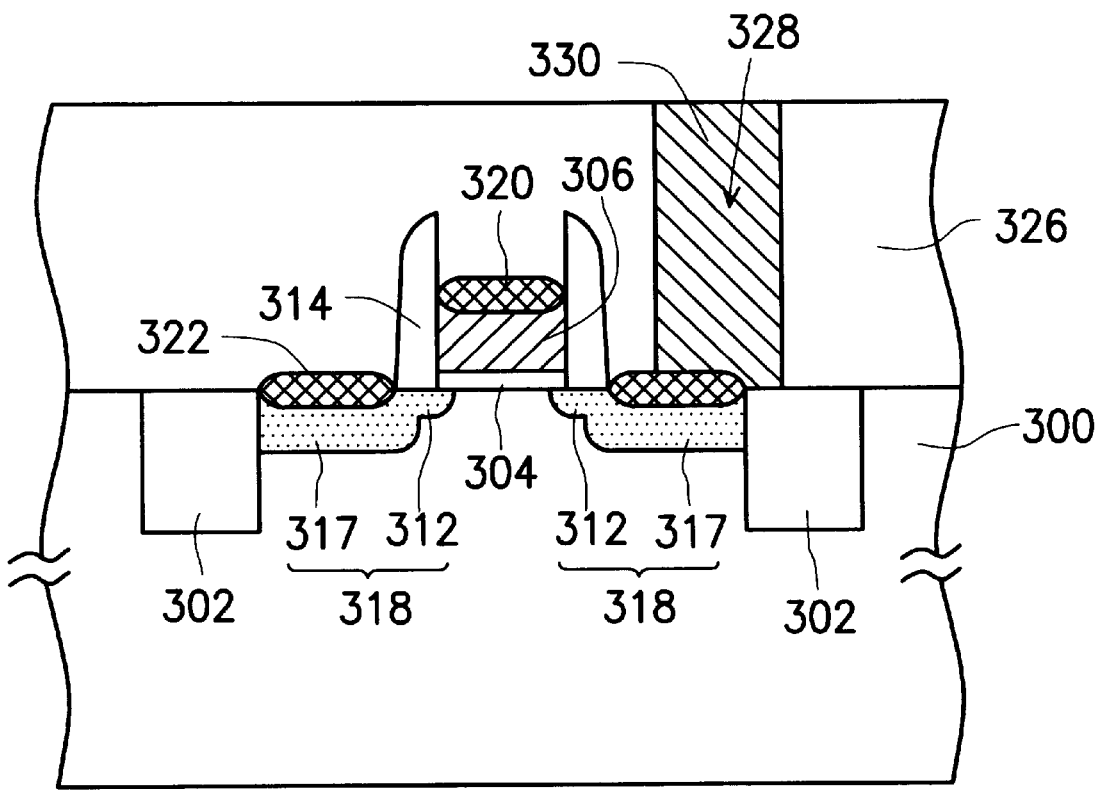

Referring further to FIG. 3D, in the subsequent step, a thermal annealing process, preferably a rapid thermal annealing (RTA) process, is performed on the wafer so as to cause the metal atoms in the metallization layer 319 (FIG. 3C) to react with the silicon atoms in the polysilicon gate 306 and the source/drain regions 318. Through this process, the metallization layer 319 (FIG. 3C) is converted into silicide. After this, a wet etching process is performed on the silicide to remove selected portions thereof, with the remaining portions being laid over the polysilicon gate 306 and the source/drain regions 318 (the silicide laid over the polysilicon gate 306 is designated by the reference numeral 320, and the silicide laid over the source/drain regions 318 is designated by the reference numeral 322). In the case of using titanium to form the metallization layer 319, for example the RTA process is performed by raising the temperature rapidly up to a level of 800–850° C. so as to cause the titanium atoms in the metallization layer 319 to react with the silicon atoms in the polysilicon gate 306 and the source/drain regions 318 to thereby form low-resistance orthogonal-phase C-54 titanium suicide. After this, an aqueous solution of $H_2O_2$ and $NH_4OH$ is used as the etchant in the wet etching process to remove the unreacted portions of the titanium, with the reacted portions (i.e., the silicide layers 320, 322) remaining over the polysilicon gate 306 and the source/drain regions 318.

Figure 1:
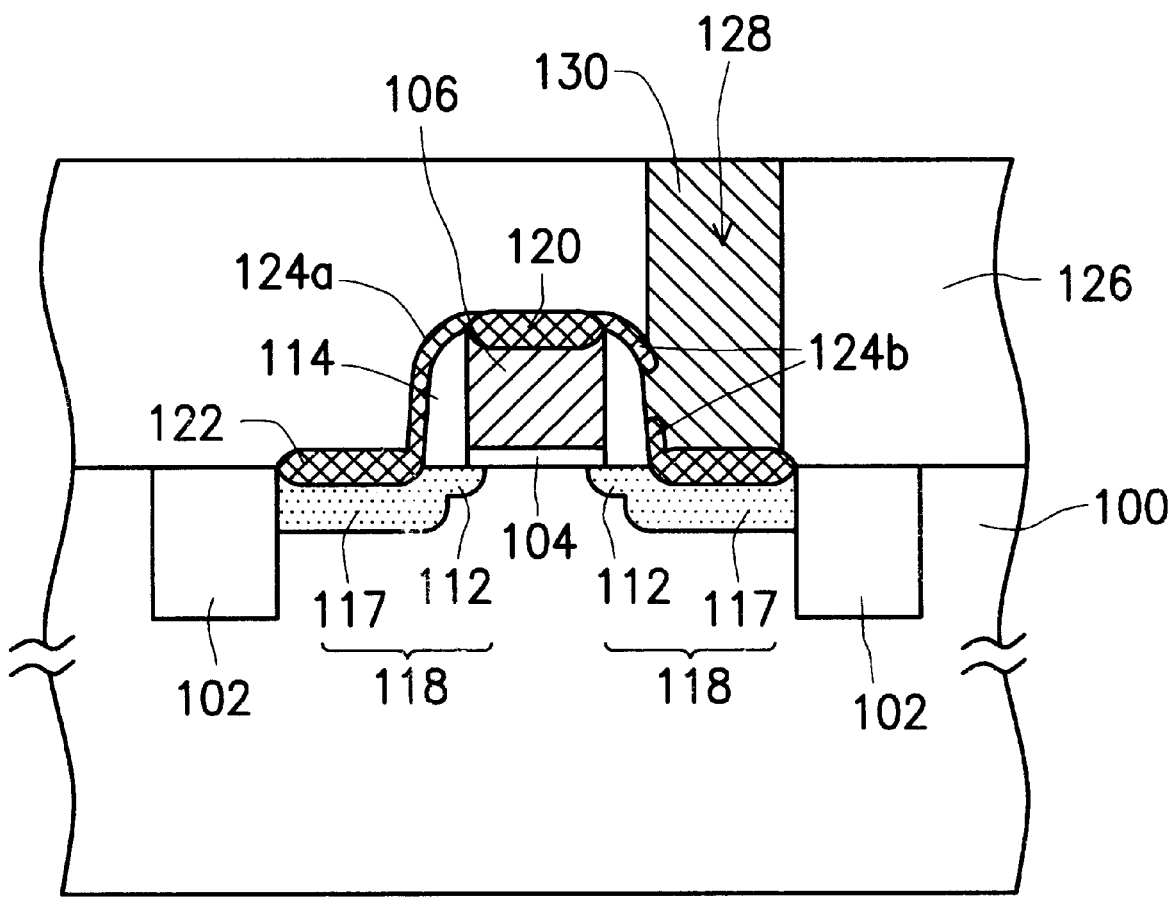
FIG. 1 is a schematic sectional diagram used to depict a conventional method for forming self-aligned silicide in a MOS IC device.

In the foregoing method of the invention, since the polysilicon gate 306 is recessed relative to the spacer structure 314, the spacer structure 314 can act like an elevated barrier to the polysilicon gate 306, which barrier can help prevent the occurrence of a bridging effect between the polysilicon gate 306 and the source/drain regions 318 caused by the forming of undesired suicide over the spacer structure 314 in the subsequent processes. The method of the invention can therefore help prevent the bridging effect between the polysilicon gate and the source/drain region and also the short-circuit between the polysilicon gate and the subsequently formed metal plug that would otherwise occur in the prior art of FIG. 1. Moreover, since the field oxide layers 302 can virtually remain intact during the removal of the etch-end layer 308 through etching, it can prevent the occurrence of leakage current from the metal plug 330 to the substrate 300.

In conclusion, the method of the invention is characterized by the provision of an elevated spacer structure that can act like a barrier to prevent the bridging effect between the polysilicon gate and the source/drain regions caused by the forming of undesired suicide over the spacer structure in the subsequent processes due to lateral diffusion of the silicide from the polysilicon gate.

Moreover, the method of the invention is characterized in the use of two different materials to respectively form the sacrificial layer and the field oxide layers, thus allowing the field oxide layers to remain substantially intact during the removal of the sacrificial layer through etching. This feature can help prevent the occurrence of leakage current from the metal plug to the substrate.

The invention has been described using exemplary preferred embodiments. However, it is to be understood that the scope of the invention is not limited to the disclosed embodiments. On the contrary it is intended to cover various modifications and similar arrangements. The scope of the claims, therefore, should be accorded the broadest interpretation so as to encompass all such modifications and similar arrangements.

What is claimed is:

1. A method for forming self-aligned silicide in an integrated circuit without causing a bridging effect, the method comprising the steps of:

preparing a semiconductor substrate;

forming a gate oxide layer at a selected location over the substrate;

forming a polysilicon gate over the gate oxide layer;

forming an etch-end layer over the polysilicon gate;

forming a sacrificial layer over the etch-end layer;

forming a spacer structure on the sidewall of the stacked structure of the gate oxide layer, the polysilicon gate, the etch-end layer, and the sacrificial layer;

forming source/drain regions in the substrate;

performing an etching process to remove the entire sacrificial layer so that the etch-end layer is exposed;

removing the entire etch-end layer;

forming a metallization layer over the entire wafer;

performing a thermal annealing process to allow those portions of the metallization layer that are laid directly over the polysilicon gate and the source/drain regions to be converted into silicide; and removing all the unreacted part of the metallization layer.

2. The method of claim 1, wherein the sacrificial layer is formed from polysilicon.

3. The method of claim 1, wherein the etch-end layer is formed from silicon oxide.

4. The method of claim 2, wherein the etch-end layer is formed from silicon oxide.

5. The method of claim 1, wherein the etch-end layer is formed to a thickness of 20–80 Å.

6. The method of claim 4, wherein the etch-end layer is formed to a thickness of 20–80 Å.

7. The method of claim 1, wherein the step of forming the source/drain regions comprises the substeps of:

performing a first ion-implantation process prior to the step of forming the spacer structure, so as to form lightly-doped areas in the substrate on both sides of the stacked structure of the gate oxide layer, the polysilicon gate, the etch-end layer, and the sacrificial layer; and performing a second ion-implantation process after the etch-end layer is removed and prior to the forming of the metallization layer, so as to form heavily-doped areas in the substrate and meanwhile allow the polysilicon gate to be doped to increase the conductivity thereof, the lightly-doped areas and the heavily-doped areas in combination constituting the source/drain regions.

8. The method of claim 1, wherein the metallization layer is formed from a refractory metal.

9. The method of claim 8, wherein the refractory metal is titanium.

10. The method of claim 1, wherein the thermal annealing process is an RTA process.

11. A method for forming self-aligned silicide in an integrated circuit without causing a bridging effect, the method comprising the steps of:

preparing a semiconductor substrate;

forming a gate oxide layer at a selected location over the substrate;

forming a polysilicon gate over the gate oxide layer;

forming an etch-end layer from oxide over the polysilicon gate;

forming a sacrificial layer from polysilicon over the etch-end layer;

forming a spacer structure on the sidewall of the stacked structure of the gate oxide layer, the polysilicon gate, the oxide etch-end layer, and the polysilicon sacrificial layer;

forming source/drain regions in the substrate;

performing an etching process to remove the polysilicon sacrificial layer so that the oxide etch-end layer is exposed;

removing the oxide etch-end layer;

forming a metallization layer over the entire wafer;

performing a thermal annealing process to allow those portions of the metallization layer that are laid directly over the polysilicon gate and the source/drain regions to be converted into silicide; and removing all the unreacted part of the metallization layer.

12. The method of claim 11, wherein the step of forming the source/drain regions comprises the substeps of:

performing a first ion-implantation process prior to the step of forming the spacer structure, so as to form lightly-doped areas in the substrate on both sides of the stacked structure of the gate oxide layer, the polysilicon gate, the oxide etch-end layer, and the polysilicon sacrificial layer; and performing a second ion-implantation process after the oxide etch-end layer is removed and prior to the forming of the metallization layer, so as to form heavily-doped areas in the substrate and meanwhile allow the polysilicon gate to be doped to increase the conductivity thereof, the lightly-doped areas and the heavily-doped areas in combination constituting the source/drain regions.

13. The method of claim 11, wherein the oxide etch-end layer is formed to a thickness of 20–80 Å.

14. The method of claim 12, wherein the oxide etch-end layer is formed to a thickness of 20–80 Å.

15. The method of claim 11, wherein the metallization layer is formed from a refractory metal.

16. The method of claim 12, wherein the metallization layer is formed from a refractory metal.

17. The method of claim 15, wherein the refractory metal is titanium.

18. The method of claim 16, wherein the refractory metal is titanium.

19. The method of claim 11, wherein the thermal annealing process is an RTA process.

20. The method of claim 17, wherein the thermal annealing process is performed at a temperature of 800–850° C.

* * * * *